United States Patent [19]

Miyazaki et al.

[11] Patent Number: 5,057,721

[45] Date of Patent: Oct. 15, 1991

[54] LEVEL SHIFT CIRCUIT FOR CONTROLLING A DRIVING CIRCUIT

[75] Inventors: Hideki Miyazaki; Akihiko Kanouda; Kozo Watanabe; Kenichi Onda, all of Hitachi, Japan; Yasuo Matsuda, East Chaester, N.Y.

[73] Assignee: Hitachi, Ltd., Tokyo, Japan

[21] Appl. No.: 540,269

[22] Filed: Jun. 19, 1990

[30] Foreign Application Priority Data

Jun. 19, 1989 [JP] Japan .................................. 1-154672

[51] Int. Cl.[5] ..................... H03K 19/096; H03K 17/16

[52] U.S. Cl. .................................... 307/571; 307/451; 307/530; 307/270; 307/576; 307/285; 307/296.1; 330/257

[58] Field of Search ............... 307/443, 451, 350, 530, 307/270, 571, 576, 285, 296.1; 330/257

[56] References Cited

U.S. PATENT DOCUMENTS 3,973,141 8/1976 Goldthorp ........................ 307/296.1
4,945,258 7/1990 Picard et al. ......................... 307/270

OTHER PUBLICATIONS

PCIM proceeding '88, "A High Performance Monolithic DMOS Bridge for Motor Drive", pp. 32-40.

*Primary Examiner*—Stanley D. Miller
*Assistant Examiner*—Margaret Rose Wambach
*Attorney, Agent, or Firm*—Antonelli, Terry, Stout & Kraus; Antonelli, Terry & Wands et al.

[57] ABSTRACT

The switching of the positive (or pullup power) and negative (or pulldown power) semiconductor elements, are controlled by driving circuits which are in turn controlled by level shift circuits which have a first current control circuit and a second current control circuit coupled in parallel and this parallel connection is coupled in series with the control N-channel MOSFET of a current mirror circuit in a circuit loop arrangement with a control power supply. The first and second current control circuits are responsive to first and second control pulses of pulse widths $t_1$ and $t_1+t_2$, in accordance with a driving signal such that the first current control circuit supplies a first current level to the control N-channel MOSFET during the first time period $t_1$ and the second current control circuit supplies a second current level, smaller than that of the first current level, thereto for a predetermined time period $t_1+t_2$ thereby resulting in a current flow through the controlled N-channel MOSFET of the current mirror circuit of a current value corresponding to the sum of the first and second current levels. The controlled N-channel MOSFET, providing ON/OFF control of a P channel MOSFET, is disposed in a second circuit loop which is powered by a high voltage power supply. This P-channel MOSFET, coupled to the high voltage power supply, supplies an output signal to a load in response to the current flowing through the controlled N-channel MOSFET.

23 Claims, 4 Drawing Sheets

I ≦ Vth / Rd

LEVEL SHIFT CIRCUIT FOR CONTROLLING A DRIVING CIRCUIT

BACKGROUND OF THE INVENTION

1. Field of the Invention

The present invention relates to a driving circuit for a semiconductor device used in a power integrated circuit.

2. Summary of the Prior Art

A bridge inverter for driving a load, such as a motor, by connecting in series two identical voltage-switching elements is known. Such switching elements are connected across a main d.c. voltage source, with that one of the switching elements connected to the high potential side of that source being referred to as an upper arm switching element and the other switching element thereof connected to the low potential side of the voltage source being referred to as a lower arm switching element. By switching those switching elements successively, a drive voltage becomes generated at their point of interconnection and is applied to the load.

To drive the upper arm switching element, it is necessary to apply a driving voltage between a control terminal, which controls the switching of the upper arm switching elements, and the point of connection between the two switching elements. When the lower arm switching element is switched on, the potential of the point of interconnection between the switching elements drops to a level similar to the lower potential side of the main d.c. voltage source. In a similar way, when the upper arm switching element is turned on, the potential of the connection point (or common connection node) of the two switching elements is similar to that of the high potential side of the main d.c. voltage source.

Hence, in order to drive the upper arm switching element, it is necessary to have a separate d.c. voltage source having a standard mid-point potential between the upper and the lower arms.

Consider now the case where it is desired to generate a polyphase signal to the load. In that case, each phase requires a corresponding pair of upper and lower arm switching elements, and the switching elements of the lower arms can be driven from a single power source. However, a separate D.C. insulated power source is required to drive each upper arm switching element. The above driving circuit is described in PCIM'88 Proceedings PP. 32–40 "A high performance Monolithic DMOS bridge for motor drive".

The above mentioned inverter requires a level shift circuit which transfers a signal to a potential equal to the voltage of a main power source applied between the input terminal of a positive power element and the output terminal of a negative power element.

The well-known level shift circuit is not suitable for use in a high voltage difference condition, such as above one hundred volts. Further, there is a trade-off relation between high voltage characteristics or signal transfer speed and the power loss.

SUMMARY OF THE INVENTION

An object of the present invention is to provide a driving circuit for a semiconductor device suitable for transferring a signal in a high voltage condition.

Another object of the present invention is to provide a driving circuit for a semiconductor device suitable for transferring a signal at high speed and with low power loss.

The present invention supplies a first high level current $I_1$ to a level shift circuit during a first predetermined period of time $t_1$, which is slightly longer than the charging time of the gate-source capacitor of a MOSFET being driven after application of a driving current. This current $I_1$ quickly charges up the capacitance between the gate-source of the MOSFET being driven. A zener diode connected across the gate and source of the MOSFET prevents an overvoltage from being applied between the gate-source and maintains the gate-source voltage at a value high enough for the MOS transistor to remain in the on state. After the completion of the first predetermined period of time $t_1$, the current flowing through the level shift circuit is reduced to a second, lower current level $I_2$, which is less than one tenth the level of the current $I_1$, and the voltage drop generated across a resistor by the current $I_2$ is supplied between the gate-source of a MOS transistor to maintain it in the on state.

BRIEF DESCRIPTION OF THE DRAWINGS

Embodiments of the present invention will now be described in detail with reference to the accompanying drawings in which.

DETAILED DESCRIPTION OF THE PREFERRED EMBODIMENTS

Figure 1:
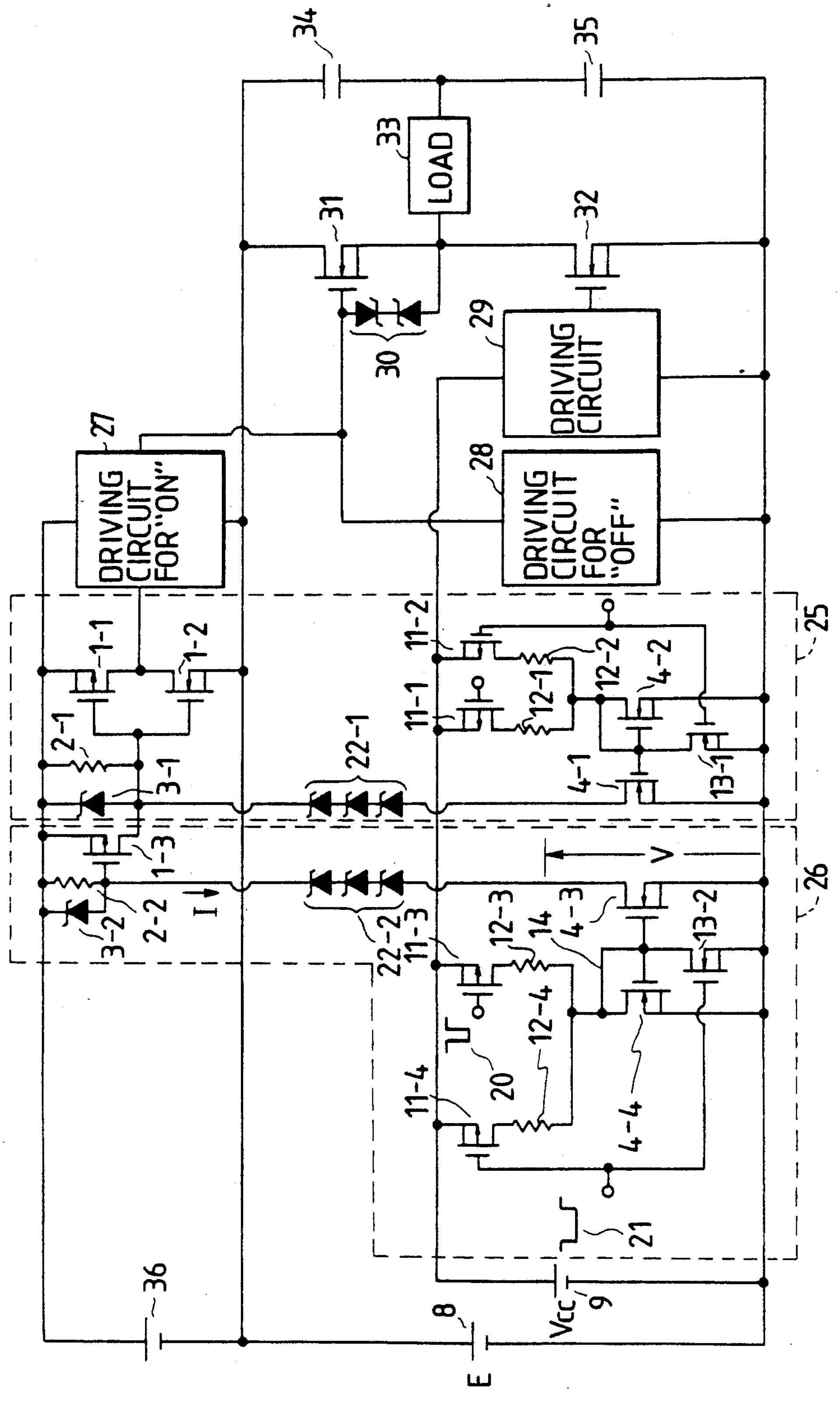
FIG. 1 is a circuit diagram showing an embodiment according to the present invention.

FIG. 1 is a circuit diagram showing an inverter circuit with a half-bridge circuit using a level shift circuit of the present invention. A positive and negative side power semiconductor elements 31, 32 and two capacitors 34 and 35 form a bridge inverter circuit. N-channels MOSFETS 31 and 32 are used, for example, as the semiconductor elements. A load 33 is connected between the junction point of elements 31 and 32 and that of the capacitors 34 and 35, as shown in FIG. 1. Two zener diodes 30 connected in series back-to-back between the gate and source of MOSFET 31 protect the MOSFET 31 from overvoltage. If the gate-source voltage rises up to a predetermined value, either zener diode begins to flow current and protects the MOSFET 31 from an overvoltage. The above circuit is similar to the driving circuit described in U.S. patent application Ser. No. 405, 233.

The N-channel MOSFET 31 is controlled by a signal from a driving circuit 27 and 28, and the N-channel MOSFET 32 is controlled by a driving circuit 29. A driving signal "ON" is transmitted to the driving circuit 27 for the positive power semiconductor element 31 using level shift circuits 25 and 26.

In the level shift circuit 25, a plurality of zener diodes 21-1 are connected in series between the drain terminal of N-channel MOSFET (or NMOSFET) 4-1 and the common connection of the gate terminal of P-channel MOSFET (or PMOSFET) 1-1 and N-channel MOSFET 1-2. The drain-gate circuit of a MOSFET 1-2 is connected to the gate-drain circuit of the P-channel MOSFET 1-1 to form a complementary MOS inverter. These series connected zener diodes 22-1 reduce a voltage applied between the drain-source circuit of MOSFET 4-1 when a driving signal is applied.

A resistor 2-1 and zener diode 3-1 are connected in parallel between the source and gate of the P-channel MOSFET 1-1.

A drain terminal of the MOSFET 4-1 is connected to the gate terminal of the P-channel MOSFET (or PMOSFET) 1-1 through the zener diodes 22-1 . The current I flowing through the MOSFET 4-1 supplies a driving voltage R·I to the MOSFET 1-1 between the source-gate circuit thereof.

A series circuit of a P-channel MOSFET 11-1 and a resistor 12-1, and a series circuit of a P-channel MOSFET 11-2 and a resistor 12-2 are connected in parallel between the drain terminal of MOSFET 4-2 and a positive electrode of a voltage source 9 having voltage amplitude $V_{cc}$.

The gate terminals of the MOSFET 4-1 and 4-2 are connected to each other, and the gate terminal of the MOSFET 4-2 is connected to the drain terminal thereof. This circuit, therefore, forms a current mirror circuit.

The gate terminal of P-channel MOSFET 11-2 is connected to the gate terminal of N-channel MOSFETs 13-1. Therefore, MOSFET 11-2 and 13-1 are operated as complementary switches. When the P-channel MOSFET 11-2 is turned OFF during the ON state of MOSFET 13-1 and the OFF state of MOSFET 4-1, the current $I_2$ is cut off. The signal 21 is applied to the gate terminal of a MOSFET 11-2. The drain-source circuit of the N-channel MOSFET 13-1 is connected in parallel between the common gate connection and the source terminal of MOSFETs 4-1 and 4-2.

When an output signal 20 of control circuit 15 is applied to the MOSFET 11-1 to turn it ON, current $I_1$ flows through the MOSFET 11-1 and current $I_2$ flows through the MOSFET 11-2 when a signal 21 is applied to the MOSFET 11-2 to turn it ON.

Figure 2:
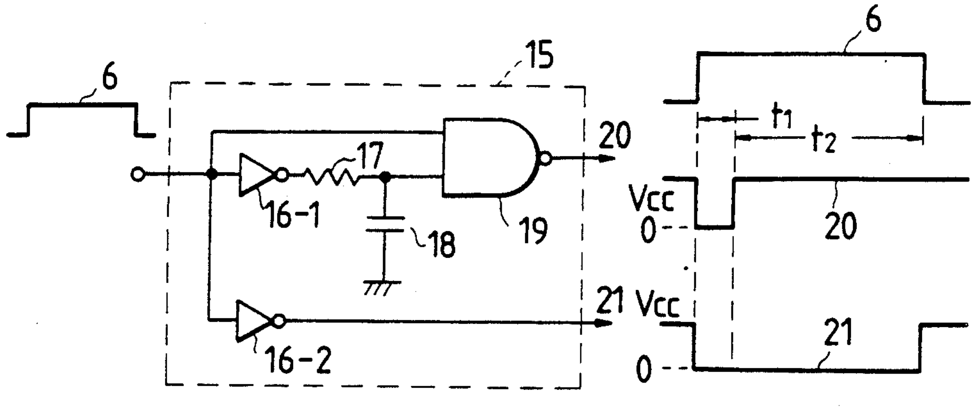
FIG. 2 is a circuit diagram showing a control circuit.

As shown in FIG. 2 the control circuit 15 includes inverters 16-1, 16-2, resistor 17, capacitor 18 and NAND circuit 19 and produces two kinds of signals 20 and 21 with different pulse widths in response to a driving signal 6. The signal 20 is a pulse signal which is initially inverted to a low level when the driving signal 6 is initially set at a high level and returns to the high level after a predetermined period of time $t_1$. The pulse width $t_1$ is determined by the time constant of the resistor 17 and capacitor 18.

The control circuit 15 supplies the pulse signal 20 to the P-channel MOSFET 11-1 during the period of time $t_1$, after the application of driving signal 6, and the P-MOSFET 11-1 is rendered in an ON state. Also the control circuit 15 supplies the signal 21 to the MOSFET 11-2 and MOSFET 13-1, and NMOSFET 13-1 is turned off. At turn-off of the NMOSFET 13-1, the MOSFETS 4-2 and 4-1 turn ON, and a current of a magnitude $I_1+I_2$ flows through MOSFET 4-2, where $I_1$ is the current flowing through MOSFET 11-1, and $I_2$ is the current flowing through MOSFET 11-2.

Now assuming that the MOSFET 4-1 and 4-2, together operating as a current mirror circuit, have a same structure, the current $I_1+I_2$ also flows into MOSFET 4-1 by the operation of current mirror circuit.

Figure 3:
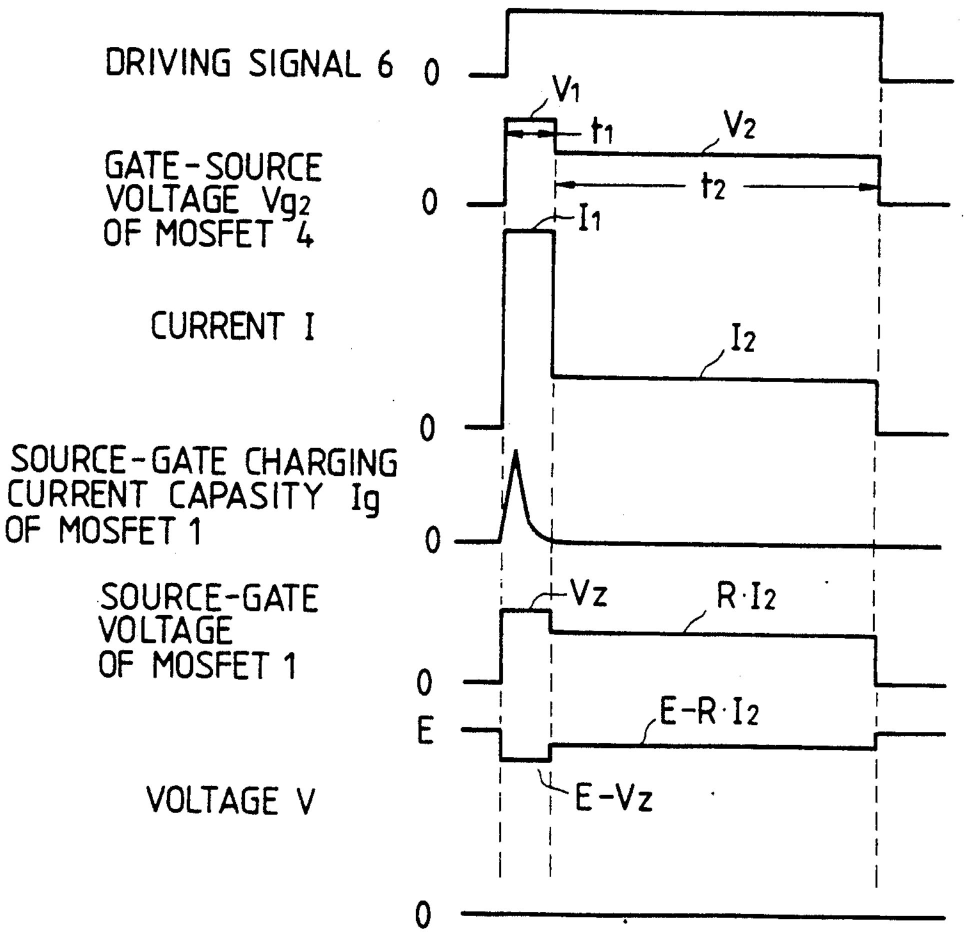
FIG. 3 is wave forms explaining the operation of the driving circuit shown in FIG. 1.

The current $I_1+I_2$ operates as a charging current for a source-gate capacitance of P-MOSFET 1-1 and which charging current turns ON the P-MOSFET 1-1 quickly. When the signal 20 returns to high level after the predetermined period of time $t_1$ has elapsed, P-MOSFET 11-1 turns off and the current $I_1$ is cut off. After cut-off of the current $I_1$, the current flowing through MOSFET 4-2 and MOSFET 4-1 is reduced to the current $I_2$, as shown in FIG. 3.

A voltage with an amplitude of $R \cdot I_2$is continuously applied between the source and gate of P-channel MOSFET 1-1 wherein MOSFET 1-1 is held in an on state. The products of voltage, current and time generated in the MOSFET 4-1 during the application of the driving signal 6, is given by the following equation (1)

$$P=\{(I_1+I_2)\cdot(E-V_Z)\cdot t_1+I_2\cdot(E-R\cdot I_2)\cdot t_2\} \quad (1)$$

In equation (1), the period of time $t_2$ is a time period from the end of time period $t_1$ to the end of the driving signal 6. As is apparent from the equation (1), if the current $I_2$ is selected to be a relatively small value in comparison with the current $I_1$, the product of voltage, current and time, that is, power loss generated in the MOSFET 4-1 is decreased.

When the driving signal 6 is changed to the low level, the MOSFET 13-1 is rendered in an on state to short-circuit the gate and source of the respective N-channel MOSFETs 4-1 and 4-2.

As a result, current $I_2$ flows through the MOSFET 13-1 and MOSFET 4-2 and MOSFET 4-1 turn OFF.

The charge stored in the capacitance between the source and gate of PMOSFET 1-1 is discharged through the resistor 2-1, and the MOSFET 1-1 is turned off.

The level shift circuit 26 also has the same circuit as the level shift circuit 25 and the level shift circuits 25 and 26 perform complementary switching action. When current flows through the MOSFET 4-1 in the level shift circuit 25, a high level signal is applied to the driving circuit 27. During this time, however, the MOSFET 4-3 remains turned OFF.

When current flows through MOSFET 4-3 of the level shift circuit 26, the PMOSFET 1-3 turns ON and effects a short-circuit across the resistor 2-1 to turn PMOSFET 1-1 OFF. As a result, NMOSFET 1-2 turns ON and a low level signal is applied to the driving circuit 27.

Figure 4:
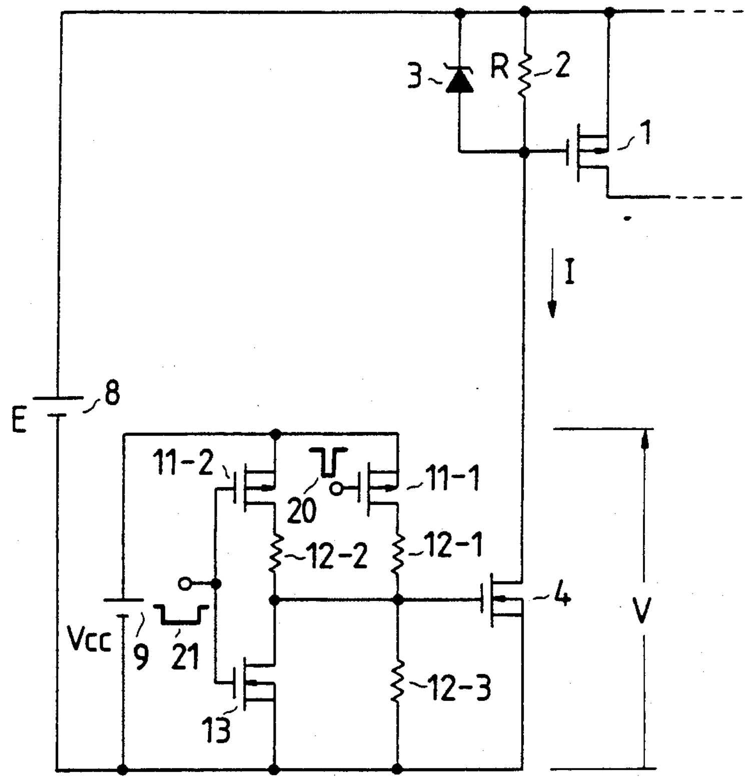
FIGS. 4 and 5 are circuit diagrams showing other embodiment according to the present invention.

FIG. 4 shows another embodiment using resistance voltage divider.

A series circuit of P-channel MOSFET 11-1 and a resistor 12-1, and a series of circuit of P-channel MOSFET 11-2 and a resistor 12-2 are connected in parallel between the gate terminal of N-channel MOSFET 4 and a positive electrode of voltage source 9 having a voltage amplitude $V_{cc}$. A resistor 12-3 and a N-channel MOSFET 13 are connected in parallel between the gate source terminal of the MOSFET 4. The signal 20 from the control circuit 15 as shown in FIG. 2 is supplied to the gate terminal of P-channel MOSFET 11-1. The gate terminal of the P-channel MOSFET 11-2 is connected to the gate terminal of N-channel MOSFET 13, and the signal 21 from the control circuit 15 is applied to these gate terminals.

After the application of the driving signal 6, PMOSFETs 11-1 and 11-2 are rendered in an on state. Now assuming that the on state resistance of PMOSFET 11-1 and PMOSFET 11-2 are sufficiently smaller than the resistors 12-1 and 12-2, the gate-source voltage of MOSFET 4 is effectively determined by multiplying the voltage $V_{cc}$ by the value of the resistor 12-3 divided by the resulting resistance effected by the resistors 12-1, 12-2 and 12-3, depending upon whether this occurs during the $t_1$ or $t_2$ time period (see the values for Vg2 in the waveforms of FIG. 3). The voltage amplitude across the drain-source of NMOSFET 4 corresponds to the voltage amplitude V, as shown in FIG. 3.

After the end of the time period $t_1$, PMOSFET 11-1 is rendered "OFF" and at this time a gate-source voltage of NMOSFET 4 of a different value is determined. More specifically, upon the completion of the period of time $t_1$, the MOSFET 11-1 turns to the OFF state. The gate-source voltage of NMOSFET 4, at this time, is given by multiplying the voltage $V_{cc}$ by the resistance of the resistor 12-3 divided by the sum of the resistances of resistors 12-2 and 12-3. This value corresponds to the voltage $V_2$ as shown in FIG. 3. In this case, the relation $V_1<V_2$ is satisfied by setting the resistance of the resistor 12-1 at a resistance smaller than that of the resistor 12-2.

Figure 5:
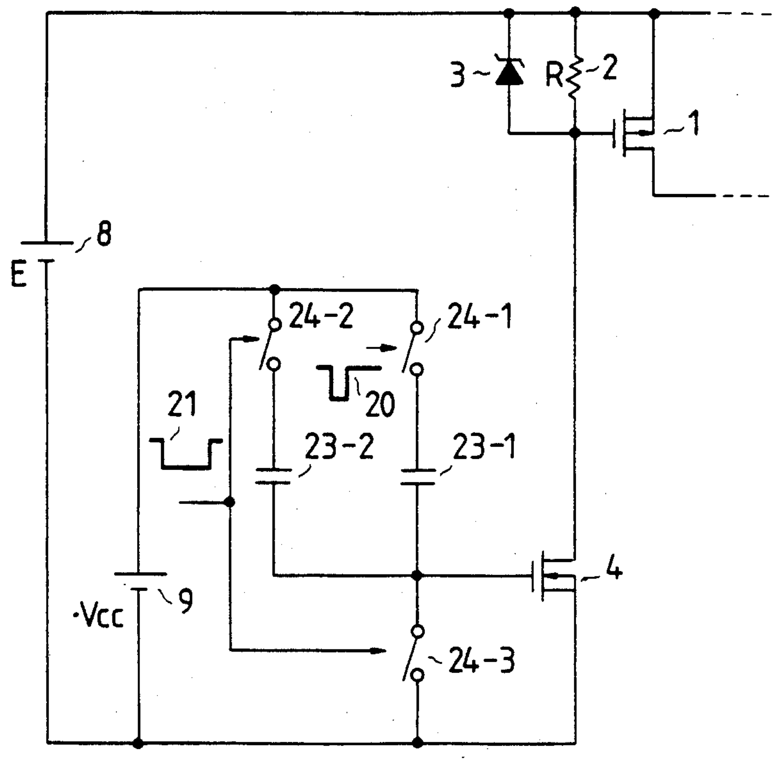

In the other embodiment shown in FIG. 5, a series circuit of a switch 24-1 and a capacitor 23-1, and a series circuit of a switch 24-2 and a capacitor 23-2 are connected in parallel between a gate terminal of MOSFET 4 and a positive electrode of voltage source of an amplitude $V_{cc}$. A switch 24-3 is connected between the gate-source circuit of NMOSFET 4.

The switch 24-1 is rendered in an ON state or OFF state when the control signal 20 is low level or high level, respectively. Further, the switches 24-2 and 24-3 operate as complementary switches with respect to each other in response to the signal 21 from the control circuit 15. That is, when the switch 24-2 is rendered to an ON(OFF) state, the switch 24-3 is rendered to an OFF(ON) state. When is at the high level, signal 21 the switch 24-2 turns off and when signal 21 is at the low level the switch 24-3 turns ON.

After the application of the driving signal both the switches 24-1 and 24-2 turn ON by the signal 20 during the predetermined period of time $t_1$. As a result, the gate-source voltage of MOSFET 4 during the time period $t_1$ is equal to a voltage corresponding to the voltage $V_{cc}$ multiplied by the ratio of the resultant capacitance of capacitors 23-1 and 23-2 to the sum of the gate-source capacitance and capacitance of capacitors 23-1 and 23-2. This voltage corresponds to voltage $V_1$ shown in FIG. 3.

After the period of time $t_1$, the switch 24-1 is rendered to an OFF state, and the switch 24-2 continues to be in an On state. At this time the gate-source voltage of MOSFET 4 is given by multiplying the voltage $V_{cc}$ by the ratio of the capacitance of capacitor 23-2 to the sum of the capacitance of the gate-source capacitance of MOSFET 4 and capacitor 23-2.

The value above corresponds to the voltage $V_2$ as shown in FIG. 3. The relation $V_1>V_2$ is satisfied by setting the capacitance of the capacitor 25-1 at the value less than that of the capacitor 23-2.

The above embodiments have a feature that it is possible to reduce the power loss and which facilitate forming the circuit on a common semiconductor substrate as an integrated circuit.

Figure 6:
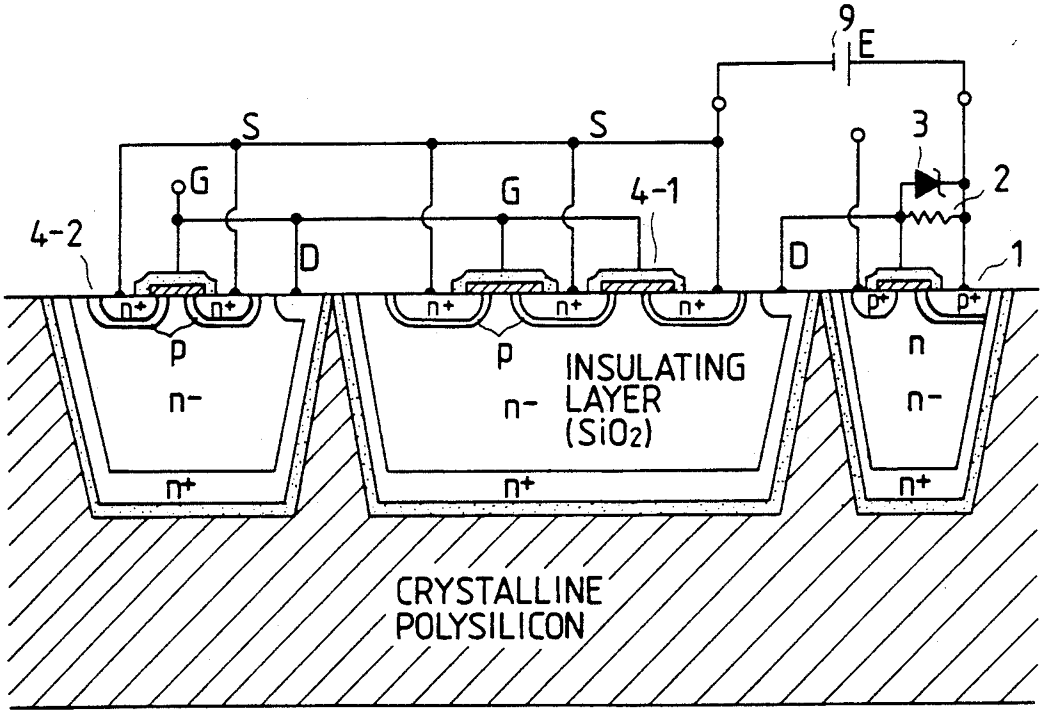
FIG. 6 is a cross sectional view of the semiconductor device explaining the arrangement of the driving circuit according to the present invention.

In FIG. 6 MOSFET 4-1, 4-2, and 1 are formed on a single polysilicon substrate and each element is separated by an insulating material of dielectric layer $SiO_2$.

In the present invention as shown in FIG. 3, large current $I_1$ flows during the period of time $t_1$ at the beginning of driving of P-channel MOSFET-1. The period of time $t_1$ is very short, for example several μs.

During a period of time $t_2$ following the period of time $t_1$, the magnitude of current is reduced to $I_2$ considerably lower than the current $I_1$ to reduce the generation of the heat. Therefore, the present invention is suitable in making the integrated circuit as the present invention is able to reduce the generation of the heat which is lead to the breakage of elements.

Figure 7:
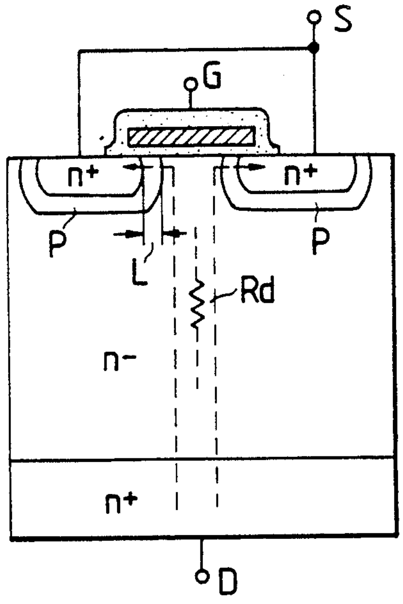
FIG. 7 is a cross sectional view of the high voltage MOSFET.

As shown in FIG. 7, resistance Rd of n− layer and the resistor of the channel are connected in series. The resistance Rd of the N− layer of high voltage MOSFET, used in the present invention, has a very large resistance in comparison with that of channel when a rating voltage is applied between its gate and source.

Figure 8:
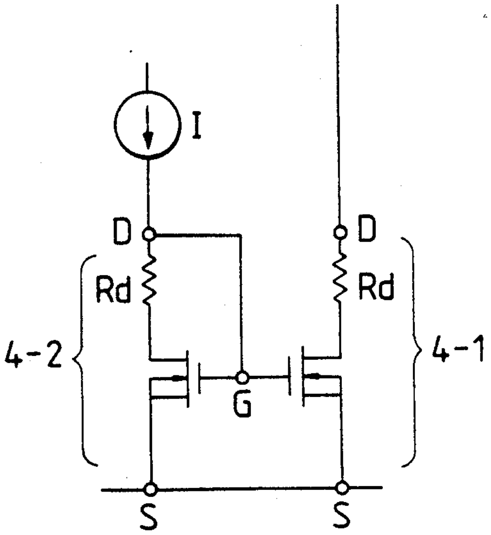
FIG. 8 is an equivalent circuit explaining a current mirror circuit.

FIG. 8 shows a current mirror circuit including high voltage MOSFETs 4-1 and 4-2 as shown in FIG. 7 and a reference current source for flowing current I. Each MOSFET has a drain D, gate G and source S.

The resistance of n− layer is equivalently represented by a resistor Rd and is connected in series between the drain of the above described equivalent MOSFET and the drain terminal of MOSFET 4-1 and 4-2. In the current mirror circuit as shown in FIG. 8, the drain voltage of the equivalent MOSFET 4-2 is larger than the gate voltage by R·I and when the value is larger than the threshold voltage Vt, the MOSFET 4-2 operates in the non-saturated region. The high voltage V′ is applied to the drain terminal of the MOSFET 4-1.

As the gate voltage of MOSFET 4-1 is limited to a small value, the equivalent transistor is operated in the saturated region.

The transistors, such as MOSFETs 4-2 and 4-1 operate in different regions of the characteristic curve in spite of having the same gate-source voltage and, as a result, the current flowing through MOSFET 4-1 becomes larger than that of current flowing through MOSFET 4-2. Such phenomena causes the disadvantage of low power loss and breakage of the semiconductor elements.

To avoid the above problem, the present invention determines the value of the reference current so as to satisfy the following conditions.

$$I \leqq Vt/Rd \qquad (2)$$

If the equation (2) is satisfied, the current flowing through MOSFET 4-2 and 4-1 is respectively almost equal to each other and, the above problem will be solved.

We claim:

1. A level shift circuit comprising:
a control power supply;
a high voltage power supply having a voltage higher than that of said control power supply and a negative terminal coupled to the negative terminal of said control power supply;
a first transistor coupled in series to said control power supply and formed in a loop circuit arrangement with said control power supply;
a second transistor coupled in series to said high voltage power supply, formed in a different a loop circuit arrangement with said high voltage power supply, and coupled to form a current mirror circuit with said first transistor;

a third transistor coupled between the positive terminal of said high voltage power supply and said second transistor and supplying an output signal to a load in response to an output current from said second transistor;

a first current control means for supplying a first current ($I_1$) having a first amplitude to said first transistor for a first predetermined period of time ($t_1$) after application of a driving signal; and a second current control means for supplying a second current ($I_2$) having a second amplitude, smaller than that of the current $I_1$, to said first transistor for another predetermined period of time ($t_1+t_2$), including the first time period ($t_1$) plus a second time period ($t_2$), in accordance with the timing of the driving signal, wherein a resultant current $I_1+I_2$ flows through said first and second transistors during the predetermined time period $t_1+t_2$ in accordance with a current mirror effect thereof.

2. A level shift circuit according to claim 1, wherein said first current control means supplies a first voltage to a control electrode of said first transistor for the predetermined period of time $t_1$ and said second current control means supplies a second voltage smaller than that of said first voltage to the control electrode of said first transistor for the predetermined period of time $t_1+t_2$, controlled in accordance with the timing of the driving signal.

3. A level shift circuit according to claim 1, wherein said first current control means, which includes a first control terminal, is supplied with a first control voltage for the predetermined period of time $t_1$ and said second current control means, which includes a second control transistor, is supplied with a second control voltage of a greater pulse width than that of said first control voltage, corresponding to the predetermined period of time $t_1+t_2$, said first control voltage and said second control voltage are provided at respective outputs of a control circuit responsive to the driving signal.

4. A level shift circuit according to claim 1, wherein said first current control means includes a first control current path comprised of a first control transistor in series with a first resistance and said second current control means includes a second control current path comprised of a second control transistor in series with a second resistance, said first and second current paths are coupled in parallel and the parallel connection thereof is coupled in series with said first transistor of said current mirror circuit across the respective terminals of said control power supply, and said first and second control transistors are responsive to first and second control pulse widths $t_1$ and $t_1+t_2$, respectively, provided from a control circuit in accordance with the driving signal.

5. A level shift circuit according to claim 4, wherein the first and second transistors of said current mirror represent control and controlled current paths thereof, respectively, and wherein an output of the controlled current path is coupled to a control electrode of said third transistor.

6. A level shift circuit according to claim 5, wherein all transistors are MOSFETs.

7. A level shift circuit according to claim 5, wherein the first and second transistors are MOSFETs of the same channel conductivity type, and wherein the third transistor and first and second control transistors are MOSFETs of a second channel conductivity type, opposite to said first channel conductivity type.

8. A level shift circuit according to claim 7, wherein the first and second MOSFETs are N-channel type, and the third MOSFET and first and second control MOSFETs are P-channel type.

9. The level shift circuit according to claim 8, wherein there is further included a shorting switch turning OFF said current mirror circuit at the end of the predetermined time period $t_1+t_2$.

10. A level shift circuit according to claim 1, wherein there is further included a shorting switch turning OFF the second transistor of said current mirror circuit at the end of the predetermined time period $t_1+t_2$.

11. A level shift circuit comprising:

a control power supply;

a high voltage power supply having a voltage higher than that of said control power supply and a negative terminal coupled to the negative terminal of said control power supply;

a first transistor coupled in series to said high voltage power supply and formed in a loop circuit arrangement with said high voltage power supply;

a second transistor coupled between said high voltage power supply nd said first transistor and supplying an output signal to a load in response to an output current from said first transistor;

a first current control means for supplying a first current ($I_1$) having a first amplitude to said first transistor for a first predetermined period of time ($t_1$) after application of a driving signal; and a second current control means for supplying a second current ($I_2$) having a second amplitude, smaller than that of the current $I_1$, to said first transistor for a predetermined period of time ($t_1+t_2$), including the first time period ($t_1$) plus a second time period ($t_2$), in accordance with the timing of the driving signal, wherein a resultant current $I_1+I_2$ flows through said first transistor.

12. A level shift circuit according to claim 11, wherein at least one of said first and second current control means includes a resistance type potential divider for dividing said control power supply and supplies it to a control electrode of said first transistor.

13. A level shift circuit according to claim 11, wherein each of said first and second current control means includes a part of a divided first portion of a resistance type potential divider in which a second portion f the resistance type divider is commonly connected to both of said first and second current control means and is coupled between one end of said first transistor and the control electrode thereof, the one end of said first transistor being coupled to the negative terminals of the control and high voltage power supplies.

14. A level shift circuit according to claim 13, wherein each of said first and second current control means further includes a resistance part of the corresponding resistance type divider in series connection with a control transistor switch between the control electrode of the first transistor and the positive terminal of the control power supply, the control transistors of said first and second current control means are responsive to first and second control pulse signals, of pulse widths $t_1$ and $t_1+t_2$, respectively.

15. A level shift circuit according to claim 14, wherein there is further included a shorting switch coupled across said second portion of the resistance type potential divider so as to turn OFF said first transistor at the end of the predetermined time period $t_1+t_2$.

16. A level shift circuit according to claim 15, wherein said first and second transistors are complementary channel type MOSFETs.

17. A level shift circuit according to claim 15, wherein said first transistor is an N-channel type MOSFET and said second transistor is a P-channel type MOSFET, the drain of the first MOSFET is coupled to the gate of the second MOSFET and the gate and source of said first MOSFET has coupled thereacross said shorting switch and said second portion of the resistance type potential divider.

18. A level shift circuit according to claim 11, wherein at least one of said first and second current control means includes a capacitance type potential divider and supplies it to a control electrode of said first transistor.

19. A level shift circuit according to claim 18, wherein said first and second transistors are complementary channel type MOSFETs.

20. A level shift circuit according to claim 11, wherein each of said first and second current control means forms a capacitance type potential divider with a common capacitance, corresponding to a parasitic gate-to-source capacitance of said first transistor, across the positive and negative terminals of said control power supply.

21. A level shift circuit according to claim 20, wherein each of said first and second current control means includes a corresponding capacitance in series with a respective control transistor between the gate electrode of the first transistor and one terminal of said control power supply, the control transistors of said first and second current control means are responsive to first and second control pulse signals of pulse widths $t_1$ and $t_1+t_2$, respectively.

22. A level shift circuit according to claim 21, wherein there is further included a shorting switch coupled across the gate-source of said first transistor and turning OFF said first transistor at the end of the predetermined time period $t_1+t_2$.

23. A level shift circuit according to claim 22, wherein said first transistor is an N-channel type MOSFET and said second transistor is a P-channel type MOSFET, the drain of the first MOSFET is coupled to the gate of the second MOSFET.

* * * * *